(12) United States Patent
He et al.

(10) Patent No.: US 12,347,132 B2
(45) Date of Patent: Jul. 1, 2025

(54) 6D POSE MEASUREMENT METHOD FOR MECHANICAL PARTS BASED ON VIRTUAL CONTOUR FEATURE POINTS

(71) Applicant: ZHEJIANG UNIVERSITY, Hangzhou (CN)

(72) Inventors: Zaixing He, Hangzhou (CN); Wuxi Feng, Hangzhou (CN); Xinyue Zhao, Hangzhou (CN)

(73) Assignee: ZHEJIANG UNIVERSITY, Hangzhou (CN)

(*) Notice: Subject to any disclaimer, the term of this patent is extended or adjusted under 35 U.S.C. 154(b) by 345 days.

(21) Appl. No.: 17/915,470

(22) PCT Filed: Nov. 13, 2020

(86) PCT No.: PCT/CN2020/128623
§ 371 (c)(1),
(2) Date: Sep. 28, 2022

(87) PCT Pub. No.: WO2022/099597
PCT Pub. Date: May 19, 2022

(65) Prior Publication Data
US 2023/0135674 A1      May 4, 2023

(51) Int. Cl.
*G06T 7/73*    (2017.01)
*G06F 30/00*   (2020.01)
(Continued)

(52) U.S. Cl.
CPC ............... *G06T 7/73* (2017.01); *G06F 30/00* (2020.01); *G06T 7/60* (2013.01); *G06V 10/141* (2022.01);
(Continued)

(58) Field of Classification Search
CPC .... G06T 7/73; G06T 7/60; G06T 7/74; G06T 7/75; G06F 30/00; G06V 10/141;
(Continued)

(56) References Cited

U.S. PATENT DOCUMENTS

2017/0046580 A1* 2/2017 Lu ..................... G06V 10/462
2018/0081434 A1* 3/2018 Siddiqui ................ G06F 3/013
(Continued)

FOREIGN PATENT DOCUMENTS

| CN | 108509908 | 9/2018 |
|---|---|---|
| CN | 109886124 | 6/2019 |

(Continued)

OTHER PUBLICATIONS

S. Peng, Y. Liu, Q. Huang, X. Zhou and H. Bao, "PVNet: Pixel-Wise Voting Network for 6DoF Pose Estimation," 2019 IEEE/CVF Conference on Computer Vision and Pattern Recognition (CVPR), Long Beach, CA, USA, 2019, pp. 4556-4565 (Year: 2019).*

*Primary Examiner* — Amandeep Saini
*Assistant Examiner* — Emma Rose Goebel
(74) *Attorney, Agent, or Firm* — Jiwen Chen; Joywin IP Law PLLC

(57) ABSTRACT

A 6D (six degree of freedom) pose measurement method for mechanical parts based on virtual contour feature points, wherein multiple lights are used for lighting in different times for photographing, so that the success rate of recognition of geometric features in images is increased. On the basis of successful matching of lines in a real image and a template image, whether an intersection point exists between spatial lines corresponding to matching lines is calculated; when an intersection point exits between the lines, coordinates of the intersection point of planar lines in the real image and the template image are resolved and are saved as a matching point pair; and then, ellipse features in (Continued)

the real image and the template image are detected, and two centers are matched according to the distances between the centers and the matching lines and are saved as a center pair if successfully matched; and finally, a 2D-3D relationship of the real image is established according to a 2D-3D coordinate relationship of the template image, and the pose of a part is resolved by a PnP algorithm.

6 Claims, 4 Drawing Sheets

(51) Int. Cl.
    *G06T 7/60* (2017.01)
    *G06V 10/141* (2022.01)
    *G06V 10/46* (2022.01)
    *G06V 10/74* (2022.01)
    *G06V 10/75* (2022.01)
    *G06V 10/80* (2022.01)

(52) U.S. Cl.
    CPC ............ *G06V 10/46* (2022.01); *G06V 10/751* (2022.01); *G06V 10/761* (2022.01); *G06V 10/806* (2022.01)

(58) Field of Classification Search
CPC .... G06V 10/46; G06V 10/751; G06V 10/761; G06V 10/806
See application file for complete search history.

(56) References Cited

U.S. PATENT DOCUMENTS

| | | | |
|---|---|---|---|
| 2018/0253108 A1* | 9/2018 | Heinla | G05D 1/2435 |
| 2019/0138801 A1* | 5/2019 | Psota | G06T 7/73 |
| 2019/0004134 A1 | 10/2019 | Mauchly et al. | |
| 2019/0318482 A1* | 10/2019 | Raag | G06V 20/588 |
| 2020/0320334 A1* | 10/2020 | Ramachandrula | G06V 10/44 |
| 2022/0277573 A1* | 9/2022 | Makino | G06T 7/60 |

FOREIGN PATENT DOCUMENTS

| | | |
|---|---|---|
| CN | 109887030 | 6/2019 |
| CN | 110044261 | 7/2019 |
| CN | 111121655 | 5/2020 |
| CN | 111311618 | 6/2020 |
| CN | 111508021 | 8/2020 |

* cited by examiner

6D POSE MEASUREMENT METHOD FOR MECHANICAL PARTS BASED ON VIRTUAL CONTOUR FEATURE POINTS

This is a U.S. national stage application of PCT Application No. PCT/CN2020/128623 under 35 U.S.C. 371, filed Nov. 13, 2020 in Chinese, which is hereby incorporated by reference.

BACKGROUND OF THE INVENTION

1. Technical Field

The present invention relates to the field of computer vision, in particular to a 6D (six degree of freedom) pose measurement method for mechanical parts based on virtual contour feature points.

2. Description of Related Art

Accurate guide of robot arms has always been an important constituent part of industrial automation. However, most existing robots on assembly lines can only move and perform gripping along a preset path based on a preset program. In fact, the robots in such an operating mode can hardly adapt to the more and more complicated industrial application scenarios at present. In this operating mode, whether the robots can be accurately guided depends, to a great extent, on whether parts are accurately placed; and the robots can only grip one types of parts based on the preset path and program, and the robot arm has to be recalibrated and the path has to be re-planned when the objects to be gripped are changed. Therefore, both the working efficiency and accuracy of the robots in this operating mode need to be improved. In view of this, it appears to be particularly important to develop a reliable robot arm guiding method.

The common solution to the above problem in the present industrial field is to install a camera on the robot arm to acquire pose images of parts and then perform 6D pose recognition on the parts according to the images. There are two mainstream methods for 6D pose measurement of objects according to hardware facilities used during 6D pose measurement. According to one method, surface point clouds of an object are acquired by means of three-dimensional vision, and the pose of the object is calculated according to the surface point clouds. This method can acquire complete information of the object, and the accuracy of a pose calculation result is high. However, since the point clouds of the object are acquired by laser radiation, accurate surface point cloud information of the object cannot be acquired by a measuring instrument in case of serious light reflection of the surface of the object, thus, this method is not suitable for measuring reflective objects. Moreover, because a large amount of point cloud data needs to be processed, this method has the defects of high calculation cost and low speed. According to the other method, three-dimensional images are used for measurement, so this method has the advantages of low cost, small calculation amount and high speed. However, this method depends on texture information on the surface of a target object and requires remarkable feature points, but common industrial metal parts have little surface texture information, which makes this method inapplicable to metal parts.

In view of the defects of the existing methods, the present invention provides a novel 6D pose measurement method for mechanical parts. According to a novel 6D pose measurement method for mechanical parts, a part model is established first, a few of sparse template images are generated, edge feature lines and ellipses of a part in a real image and the template images are detected by a line detection algorithm and an ellipse detection algorithm; after that, the lines in the real image and the template images are matched, and then intersection point matching and center matching are performed according to matching lines; and finally, a real 6D pose of the part is resolved by means of a PnP function in OPENCV.

BRIEF SUMMARY OF THE INVENTION

To overcome the defects of the above-mentioned pose estimation methods, the present invention provides a 6D pose measurement method for mechanical parts based on virtual contour feature points, comprising the following steps:

Step 1: photographing a part twice under different light conditions to extract line features respectively, and fusing the line features;

Step 2: resolving intersection points of spatial lines corresponding to lines recognized from a template image;

Step 3: performing intersection point matching on planar lines in the template image and in a real image if the spatial lines corresponding to the lines in the template image has an intersection point therebetween;

Step 4: extracting ellipse features from the real image, and describing the ellipse features according to matching lines;

Step 5: extracting ellipse features from the template image, and describing the ellipse features according to the matching lines;

Step 6: matching the ellipse features in the real image with the ellipse features in the template image;

Step 7: matching a center in the real image with a in the template image to generate a 2D-2D matching point pair; and Step 8: establishing a line intersection point and center 2D-3D point pair of "real image-CAD model" by means of a vertex coordinate file of a CAD model, and calculating a pose by a PnP algorithm.

Preferably, photographing a part twice under different light conditions to extract line features respectively and fusing the extracted line features in Step 1 specifically comprises: arranging lights and a camera; during the first time of photographing, turning on a light 1 and a light 3, and during the second time of photographing, turning on a light 2 and a light 4; extracting lines from two images, fusing two line recognition results, and processing repetitive results appearing during the result fusing process as follows:

1. Extracting an outer contour of the part, and deleting all lines except the outer contour;
2. Searching for lines with similar slopes and endpoint coordinates in the two results; and
3. Calculating a midpoint distance of a line pair obtained in Step 2; if the midpoint distance is greater than five pixels, deleting this line pair; or, if the midpoint distance is less than or equal to 5 pixels, calculating midpoints of endpoints corresponding to the two lines, using the midpoints as new endpoints, and saving the new endpoints in line recognition results.

Preferably, resolving intersection points of spatial lines corresponding to lines recognized from template image in Step 2 specifically comprises: traversing all the lines recognized from the template image with every two of the lines as a group. For each line, only 2D coordinates $(a_1,b_1)$ of endpoints of this line in the template image, and coordinates ($x_1,y_1,z_1$) of a spatial line corresponding to this line are saved, two lines to be verified whether an intersection point exists therebetween are L1 and L2 respectively, 3D coordinates of initial and end points corresponding to L1 are ($x_1,y_1,z_1$) and ($x_2,y_2,z_2$) respectively and 3D coordinates of initial and end points corresponding to L2 are ($x_3,y_3,z_3$) and ($x_4,y_4,z_4$) respectively, so whether an intersection point exists between the two lines is determined by calculation according to the following formula:

$$P=(x_1-x_3,y_1-y_3,z_1-z_3)\times(x_1-x_4,y_1-y_4,z_1-z_4)\cdot(x_1-x_2,y_1-y_2,z_1-z_2)$$

If P=0, the two lines are co-planar, and the next step is performed; or, if P≠0, the two lines are not co-planar and have no intersection point therebetween; or $$Q=(x_1-x_2,y_1-y_{32},z_1-z_{32})\times(x_3-x_4,y_3-y_4,z_3-z_4)$$

If Q=0, the two lines are parallel and have no intersection point therebetween; if Q≠0, the two lines are not parallel, and an intersection point between the two lines is resolved.

Preferably, performing intersection point matching on planar lines in the template image and in a real image if the spatial lines corresponding to the lines in the template image has an intersection point therebetween in Step 3 specifically comprises: for a pair of lines having an intersection point therebetween in space, calculating an intersection point of the pair of lines in the real image and in the template image, matching the 2D point with the 3D point calculated in Step 2, and saving a matching result.

Preferably, extracting ellipse features from the real image and the template image and describing the ellipse features according to matching lines in Step 4 and Step 5 specifically comprise: extracting the ellipse features from the real image and the template image respectively, calculating distances between an ellipse center and a plurality of closest lines nearby, and saving the distances as an array.

Preferably, matching the ellipse features and centers in the real image and the template image in Step 6 and Step 7 specifically comprise: comparing ellipses recognized from the real image and the template image according to descriptions of the ellipses, and matching centers of two ellipses meeting the following formula:

$$\text{diff}=|a-b|$$

Wherein, $a=[a_1, a_2, \ldots, a_n]$, $b=[b_1, b_2, \ldots, b_n]$, wherein $a_i$ and $b_i$ are the distance from a midpoint of an ellipse a to lines nearby and the distance from a midpoint of an ellipse b to lines nearby, respectively.

Preferably, establishing a line intersection point and center 2D-3D point pair of "real image-CAD model" by means of a vertex coordinate file of a CAD model and calculating a pose by a PnP algorithm in Step 8 specifically comprise: performing 2D-3D point pair matching from the real image to the CAD model according to the vertex coordinate file (including a corresponding relationship between 2D points in the template image and 3D points in the CAD model) generated when the template image is generated, and calculating a pose result by a PnP function according to a matching result.

The present invention has the following beneficial effects:

1) The application range is wide, virtual geometric features on images are fully used, and more accurate geometric poses of parts can be calculated independent of texture features of the parts.

2) Only two-dimensional information of a scene needs to be acquired by a common grayscale camera, and the two-dimensional information occupies little space and capable of being processed rapidly.

DETAILED DESCRIPTION OF THE INVENTION

The present invention will be further described below in conjunction with the accompanying drawings and embodiments.

Figure 1:
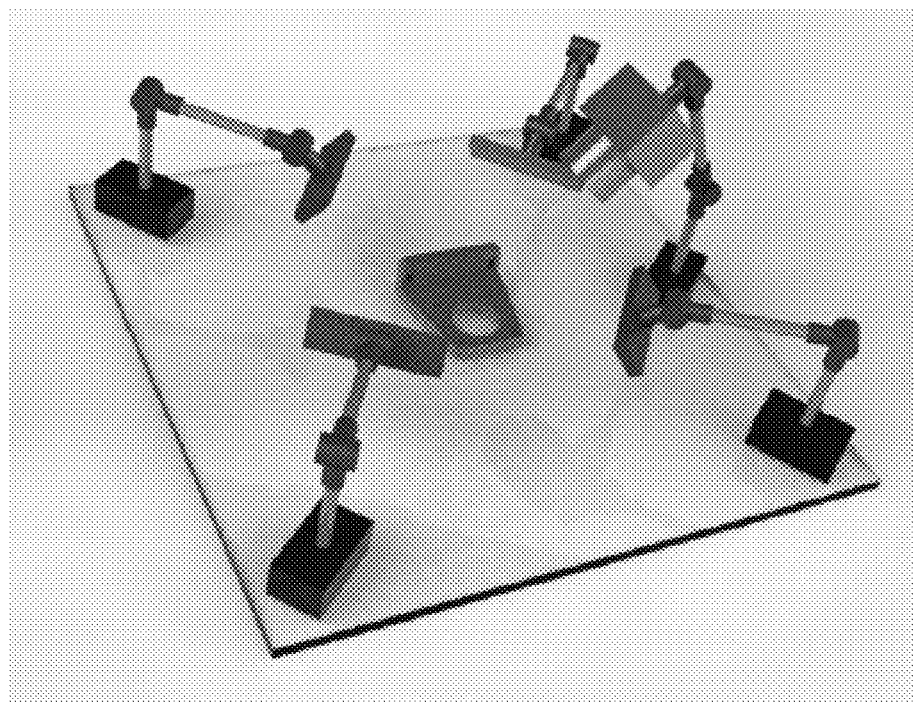
FIG. 1 is a rendering picture of light arrangement.
Figure 2:
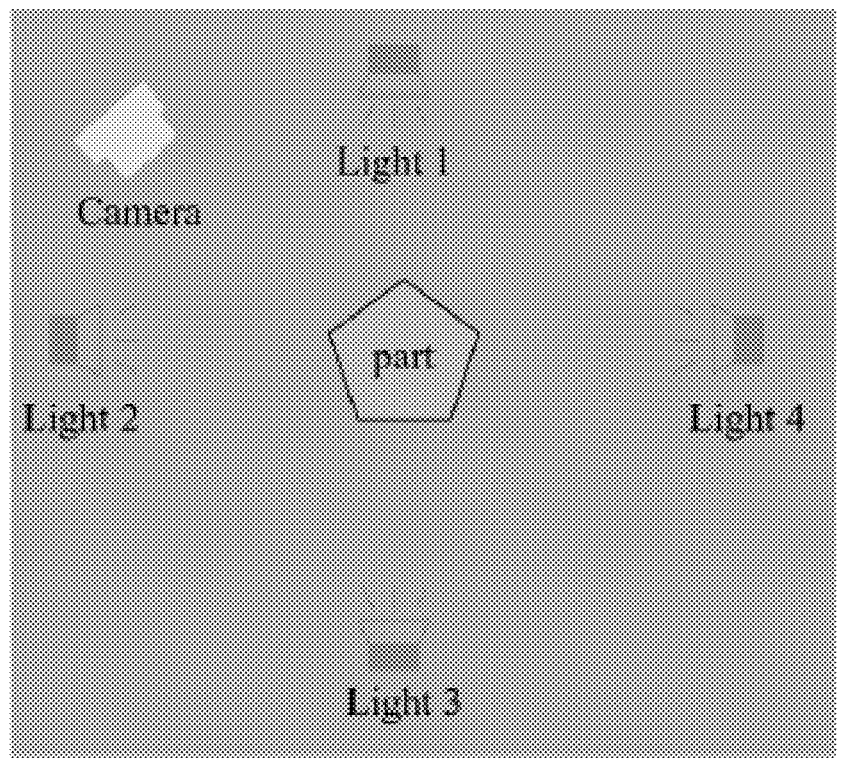
FIG. 2 is a plan view of light arrangement.

First, two images of a part are captured under different light conditions, wherein light arrangement is shown in FIG. 1 and FIG. 2; a light 1 and a light 3 are turned on to capture a first picture, a light 2 and a light 4 are turned on a capture a second image;

Then, line recognition and matching are performed on the two images by an existing method.

Next, two pairs of matching lines are randomly selected; whether an intersection point exists between spatial lines corresponding to the two pairs of matching lines is determined; if so, the intersection point between the two pairs of lines in a real image and a template image are calculated; or, if the two pairs of lines meet the following conditions:

1) The two lines are parallel to each other;
2) The intersection point between the two lines is outside of the images;
3) The distance between the two lines recognized according to the distance between intersection points is long;

Another two pairs of lines will be selected randomly to perform the above step until any one pair of lines is verified whether an intersection point exists therebetween.

Figure 3:
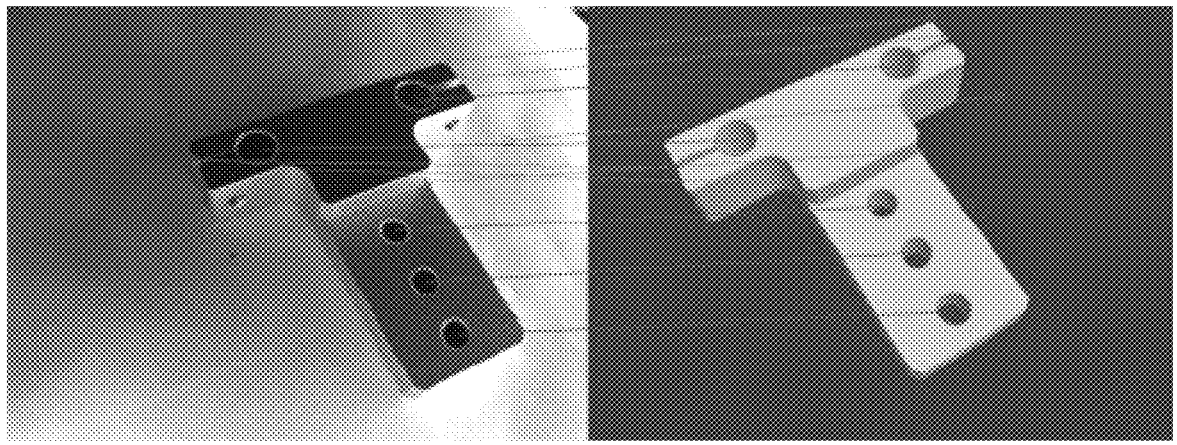
FIG. 3 illustrates a matching result of virtual geometric points.

If the intersection point of the two pairs of lines meets requirements, the intersection point is saved in the 2D-2D point pair, as shown in FIG. 3.

Figure 4:
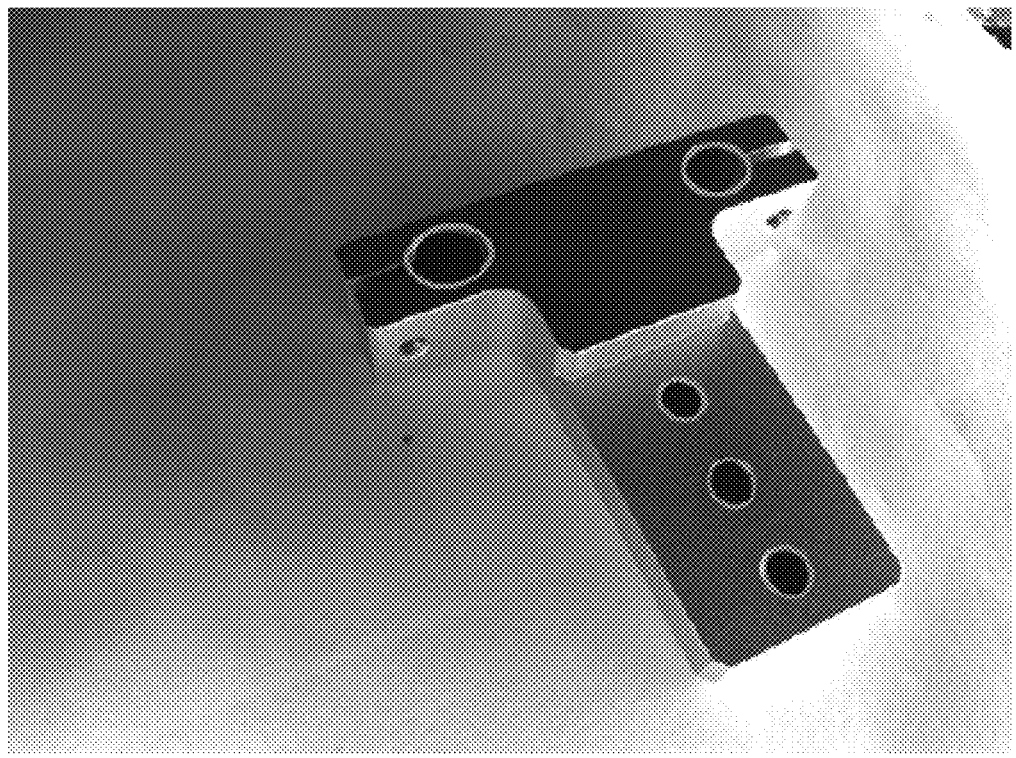
FIG. 4 illustrates an ellipse recognition result of a real image.
Figure 5:
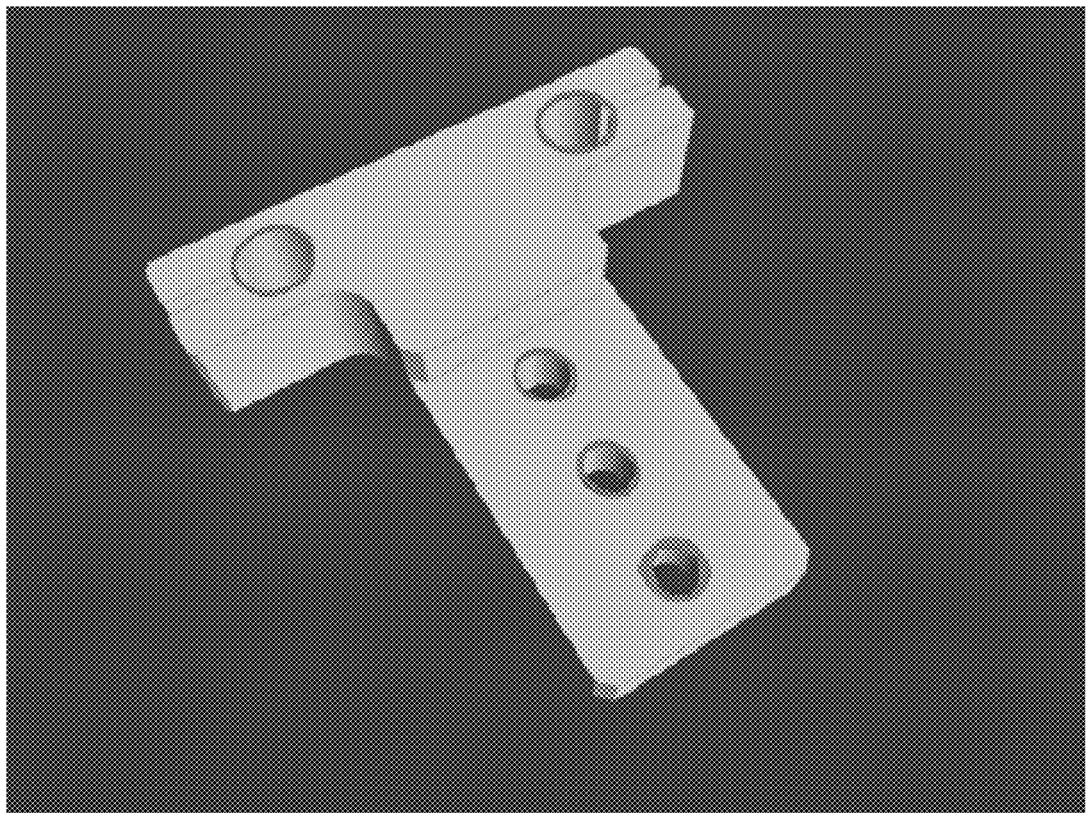
FIG. 5 illustrates an ellipse recognition result of a template image.

Next, ellipse detection is performed on the real image and the template image to recognize ellipses in the images, as shown in FIG. 4 and FIG. 5.

Figure 6:
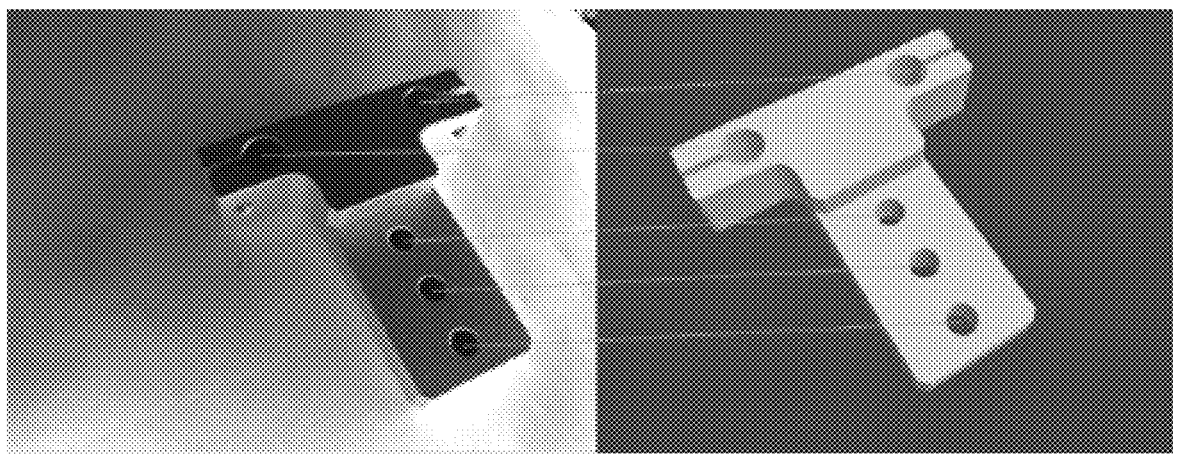
FIG. 6 illustrates a center matching result.

Next, distances from each ellipse center recognized from the real image and the template image to lines nearby are calculated to form vectors, wherein each ellipse in the template image and the real image corresponds to one vector. Next, a group of vectors in the template image and the real image is randomly selected, and a difference between the two groups of vectors is calculated to obtain a modulus. When the modulus is smaller than a set threshold, 2D coordinates of this group of centers are matched, as shown in FIG. 6.

$$\vec{a}=[x_1 x_2 \ldots x_n]$$

$$\vec{b}=[y_1 y_2 \ldots y_n]$$

$$P=\|\vec{a}-\vec{b}\|$$

Next, matching of 2D coordinates in the real image with 3D coordinates of a model is completed according to a 2D-3D coordinate corresponding relationship in a vertex file.

Figure 7:
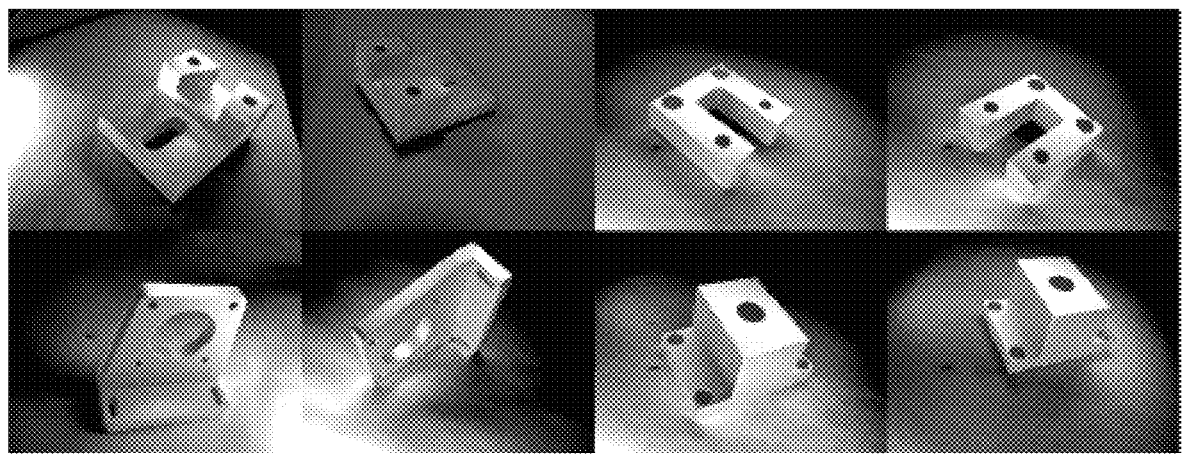
FIG. 7 illustrates superposed rendering effect pictures.

Finally, a 6D pose of the part is resolved according to the 2D coordinates in the real image and the 3D coordinates of the model by means of a PnP function in OPENCV to obtain a position vector and a rotation vector of the part, superposed rendering pictures of calculation results are shown in FIG. 7. Each picture in FIG. 7 is formed by superposing two images, one of which is a captured real image and the other one is an image formed by rendering a CAD model according to calculation results, and it can be seen, from the rendering pictures, that the rendered images almost completely overlap with original images, which indicates that the calculation results are extremely accurate.

Although the preferred embodiments of the invention have been disclosed above, these embodiments are not intended to limit the invention. Different modifications and embellishments can be made by those skilled in the art without departing from the spirit and scope of the invention. Thus, the protection scope of the invention should be defined by the claims.

The invention claimed is:

1. A 6D pose measurement method for mechanical parts based on virtual contour feature points, comprising the following steps:
    Step (1): photographing a part twice under different light conditions to extract line features respectively, and fusing the line features;
    Step (2): resolving intersection points of spatial lines corresponding to lines recognized from a template image;
    Step (3): performing intersection point matching on planar lines in the template image and in a real image if the spatial lines corresponding to the lines in the template image has an intersection point therebetween;
    Step (4): extracting ellipse features from the real image, and describing the ellipse features according to matching lines;
    Step (5): extracting ellipse features from the template image, and describing the ellipse features according to the matching lines;
    Step (6): matching the ellipse features in the real image with the ellipse features in the template image;
    Step (7): matching a center in the real image with a center in the template image to generate a 2D-2D matching point pair; and
    Step (8): establishing a line intersection point and center 2D-3D point pair of "real image-CAD model" by means of a vertex coordinate file of a CAD model, and calculating a pose by a PnP algorithm,
    wherein photographing a part twice under different light conditions to extract line features respectively and fusing the extracted line features in Step (1) specifically comprises: arranging lights and a camera; during the first time of photographing, turning on a first light and a third light, and during the second time of photographing, turning on a second light and a fourth light; extracting lines from two images, fusing two line recognition results, and processing repetitive results appearing during the result fusing process as follows:
    (a). extracting an outer contour of the part, and deleting all lines except the outer contour;
    (b). searching for lines with similar slopes and endpoint coordinates in the two results; and
    (c). calculating a midpoint distance of a line pair obtained in the Step (2); if the midpoint distance is greater than five pixels, deleting this line pair; or, if the midpoint distance is less than or equal to 5 pixels, calculating midpoints of endpoints corresponding to the two lines, using the midpoints as new endpoints, and saving the new endpoints in line recognition results.

2. The 6D pose measurement method for mechanical parts based on virtual contour feature points according to claim 1, wherein extracting ellipse features from the real image and the template image and describing the ellipse features according to matching lines in the Step (4) and Step (5) specifically comprise: extracting the ellipse features from the real image and the template image respectively, calculating distances between an ellipse center and a plurality of closest lines nearby, and saving the distances as an array.

3. The 6D pose measurement method for mechanical parts based on virtual contour feature points according to claim 1, wherein establishing a line intersection point and center 2D-3D point pair of "real image-CAD model" by means of a vertex coordinate file of a CAD model and calculating a pose by a PnP algorithm in the Step (8) specifically comprise: performing 2D-3D point pair matching from the real image to the CAD model according to the vertex coordinate file generated when the template image is generated, and calculating a pose result by a PnP function according to a matching result.

4. A 6D pose measurement method for mechanical parts based on virtual contour feature points, comprising the following steps:
    Step (1): photographing a part twice under different light conditions to extract line features respectively, and fusing the line features;
    Step (2): resolving intersection points of spatial lines corresponding to lines recognized from a template image;
    Step (3): performing intersection point matching on planar lines in the template image and in a real image if the spatial lines corresponding to the lines in the template image has an intersection point therebetween;
    Step (4): extracting ellipse features from the real image, and describing the ellipse features according to matching lines;
    Step (5): extracting ellipse features from the template image, and describing the ellipse features according to the matching lines;
    Step (6): matching the ellipse features in the real image with the ellipse features in the template image;
    Step (7): matching a center in the real image with a center in the template image to generate a 2D-2D matching point pair; and
    Step (8): establishing a line intersection point and center 2D-3D point pair of "real image-CAD model" by means of a vertex coordinate file of a CAD model, and calculating a pose by a PnP algorithm,
    wherein resolving intersection points of spatial lines corresponding to lines recognized from template image in the Step (2) specifically comprises: traversing all the lines recognized from the template image with every two of the lines as a group, wherein for each line, only 2D coordinates $(a_1,b_1)$ of endpoints of this line in the template image, and coordinates $(x_1,y_1,z_1)$ of a spatial line corresponding to this line are saved, two lines to be verified whether an intersection point exists therebetween are L1 and L2 respectively, 3D coordinates of initial and end points corresponding to L1 are $(x_1,y_1,z_1)$ and $(x_2,y_2,z_2)$ respectively and 3D coordinates of initial and end points corresponding to L2 are $(x_3,y_3,z_3)$ and $(x_4,y_4,z_4)$ respectively, so whether an intersection point exists between the two lines is determined by calculation according to the following formula:

$$P=(x_1-x_3,y_1-y_3,z_1-z_3)\times(x_1-x_4,y_1-y_4,z_1-z_4)\cdot(x_1-x_2,y_1-y_2,z_1-z_2)$$

if P=0, the two lines are co-planar, and the next step is performed; or, if P≠0, the two lines are not co-planar and have no intersection point therebetween; or $$Q=(x_1-x_2,y_1-y_{32},z_1-z_{32})\times(x_3-x_4,y_3-y_4,z_3-z_4)$$

if Q=0, the two lines are parallel and have no intersection point therebetween; if Q≠0, the two lines are not parallel, and an intersection point between the two lines is resolved.

5. The 6D pose measurement method for mechanical parts based on virtual contour feature points according to claim 4, wherein performing intersection point matching on planar lines in the template image and in a real image if the spatial lines corresponding to the lines in the template image has an intersection point therebetween in the Step (3) specifically comprises: for a pair of lines having an intersection point therebetween in space, calculating an intersection point of the pair of lines in the real image and in the template image, matching the 2D point with the 3D point calculated in the Step (2), and saving a matching result.

6. A 6D pose measurement method for mechanical parts based on virtual contour feature points, comprising the following steps:

Step (1): photographing a part twice under different light conditions to extract line features respectively, and fusing the line features;

Step (2): resolving intersection points of spatial lines corresponding to lines recognized from a template image;

Step (3): performing intersection point matching on planar lines in the template image and in a real image if the spatial lines corresponding to the lines in the template image has an intersection point therebetween;

Step (4): extracting ellipse features from the real image, and describing the ellipse features according to matching lines;

Step (5): extracting ellipse features from the template image, and describing the ellipse features according to the matching lines;

Step (6): matching the ellipse features in the real image with the ellipse features in the template image;

Step (7): matching a center in the real image with a center in the template image to generate a 2D-2D matching point pair; and Step (8): establishing a line intersection point and center 2D-3D point pair of "real image-CAD model" by means of a vertex coordinate file of a CAD model, and calculating a pose by a PnP algorithm, wherein matching the ellipse features and centers in the real image and the template image in the Step (6) and Step (7) specifically comprise: comparing ellipses recognized from the real image and the template image according to descriptions of the ellipses, and matching centers of two ellipses meeting the following formula:

$$\text{diff}=|a-b|$$

wherein, $a=[a_1,a_2,\ldots,a_n]$, $b=[b_1,b_2,\ldots,b_n]$, wherein $a_i$ and $b_i$ are a distance from a midpoint of an ellipse a to lines nearby and a distance from a midpoint of an ellipse b to lines nearby, respectively.

* * * * *